United States Patent

Fusegawa et al.

Patent Number: 5,110,404
Date of Patent: May 5, 1992

[54] METHOD FOR HEAT PROCESSING OF SILICON

[75] Inventors: Izumi Fusegawa; Hirotoshi Yamagishi; Takao Abe, all of Annaka, Japan

[73] Assignee: Shin-Etsu Handotai Co., Ltd., Tokyo, Japan

[21] Appl. No.: 496,750

[22] Filed: Mar. 21, 1990

[30] Foreign Application Priority Data

Mar. 31, 1989 [JP] Japan ............................ 1-82841

[51] Int. Cl.$^5$ ............................ H01L 21/306
[52] U.S. Cl. ............................ 156/603; 437/10; 437/12; 148/DIG. 60; 148/DIG. 71; 148/DIG. 125
[58] Field of Search ............ 148/60, 71, 125; 156/603; 437/10, 12

[56] References Cited

U.S. PATENT DOCUMENTS

| | | | |
|---|---|---|---|
| 4,140,524 | 2/1979 | Voltmer et al. | |
| 4,314,595 | 2/1982 | Yamamoto et al. | 437/10 |
| 4,548,654 | 10/1985 | Tobin | 437/10 |
| 4,851,358 | 7/1989 | Huber | 437/10 |

FOREIGN PATENT DOCUMENTS

| | | | |
|---|---|---|---|
| 0060676 | 9/1982 | European Pat. Off. | 437/10 |
| 0090320 | 10/1983 | European Pat. Off. | |
| 0251856 | 11/1987 | Fed. Rep. of Germany | 437/10 |
| 0021829 | 2/1983 | Japan | 437/10 |
| 2080780 | 2/1982 | United Kingdom | |
| 2137524 | 10/1984 | United Kingdom | |

OTHER PUBLICATIONS

IBM Technical Disclosure Bulletin, vol. 26, No. 3A, Aug. 1983, p. 1053, N.Y., U.S., K. D. Beyer et al. "Reduction of Oxygen Precipitation".
Patent Abstracts of Japan, vol. 11, No. 30 (C-400)[2477], Jan. 29, 1987 of JP-A-61 201 692 (Mitsubishi Metal Corp.) 06-09-1986.

*Primary Examiner*—Robert Kunemund
*Assistant Examiner*—Felisa Garrett
*Attorney, Agent, or Firm*—Armstrong, Nikaido, Marmelstein, Kubovcik & Murray

[57] ABSTRACT

In a method for heat process of silicon, a single crystal silicon produced by the Czochralski process is thermally processed at a low temperature ranging from 400° C. to 550° C. Outside this temperature range, the oxygen precipitate is not adequate. The result is that a predetermined oxygen precipitate can be obtained uniformly in the crystal growth direction without any reduction especially at the crystal bottom part. The resulting silicon is particularly suitable for manufacture of LSI.

11 Claims, 3 Drawing Sheets

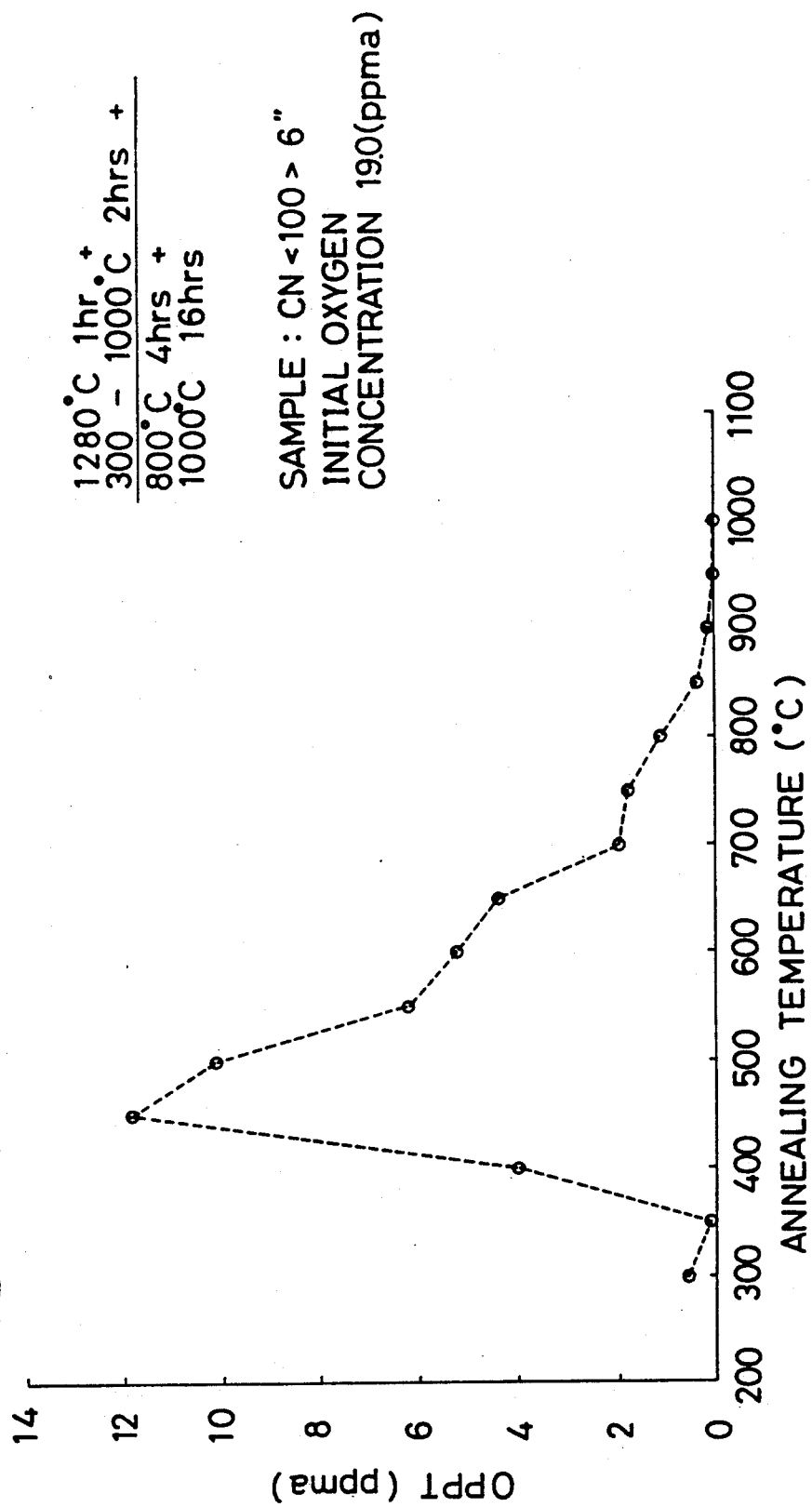

METHOD FOR HEAT PROCESSING OF SILICON

BACKGROUND OF THE INVENTION

1. Field of the Invention

This invention relates to a method for heat processing of a single crystal of silicon produced by the Czochralski process, in which method target oxygen precipitation is obtained uniformly in the direction of silicon crystal growth.

2. Description of the Related Art

It has been common knowledge that a single crystal silicon produced by the Czochralski process contains supersaturated oxygen, which is precipitated to develop oxide precipitates during heat cycles in LSI manufacture. When they are introduced into a region remote from an electronic-device-forming region, these oxide precipitates serve as the center of gettering to attract various kinds of impurities that are possibly introduced during manufacture of a LSI, thus keeping the electronic-device-forming region clean. On the other hand, when the oxide precipitates are introduced into the electronic-device-forming region, they are harmful to the electronic devices, causing deterioration of their characteristics. Consequently, for manufacturing a LSI, it is important to control the amount of precipitated oxygen in the bulk of the single crystal silicon.

The precipitation of oxygen contained in a Czochralski single crystal silicon highly depends on the initial oxygen concentration in the crystal and the heat history during the crystal growth; even in one and the same Czochralski single crystal silicon, the heat history is different between the seed crystal side and the crystal bottom side. Namely, the oxygen precipitate is large at the seed side of the single crystal silicon and small at the bottom side of the crystal silicon, thus causing a non-uniform distribution of precipitation in the crystal growth direction.

SUMMARY OF THE INVENTION

It is therefore an object of this invention to provide a method for heat processing of a silicon crystal with improved distribution of oxygen precipitation, in which predetermined oxygen precipitation can be obtained uniformly in the crystal growth direction.

According to this invention, there is provided a method for heat process of a silicon crystal, wherein a single crystal silicon produced by the Czochralski process is thermally processed at a low temperature ranging from 400° C. to 550° C. Outside the temperature range, the oxygen precipitation is not adequate.

The single crystal silicon may be a silicon wafer or a silicon ingot.

In an alternative form, a single crystal silicon may be thermally processed at a low temperature ranging from 400° C. to 550° C. in the furnace of a Czochralski crystal puller, as an after-heating step, after completion of pulling-up of the single crystal silicon.

For a more effective process, the single crystal may be taken out from the furnace, then may be thermally processed, in the form of either an ingot or a wafer, at a high temperature, lower than its melting point of about 1,200° C., and thereafter may be initialized, whereupon the resulting crystal silicon may further be thermally processed at the above-mentioned low temperature ranging from 400° C. to 550° C. If the single crystal is in the form of a wafer, it would be free from occurrence of any crystal defect or breakage during the heat process, thus bringing this invention into practice more effectively, compared to the case of an ingot. Following the above-mentioned high-temperature and low-temperature heat processes, a normal oxygen precipitation heat process may be undertaken in the manner described below so that a semiconductor integrated circuit can be produced with improved performance, thus causing an increased yield of manufacture of excellent IC products.

In the Czochralski process, since a single crystal silicon grows from a molten silicon liquid, the crystal is cooled continuously from the melting point of silicon, i.e., 1,420° C. to room temperature. Therefore, the local heat history is different between the head part and the bottom part of the single crystal silicon. To this end, according to need, the heat history during the crystal growing is desirably initialized by performing a high-temperature process, and then performing a low-temperature treatment effective for oxygen precipitation, thus realizing the uniform distribution of oxygen precipitation in the crystal growth direction.

The above and other advantages, features and additional objects of this invention will be manifest to those skilled in the art upon making reference to the following detailed description and the accompanying drawings.

BRIEF DESCRIPTION OF THE DRAWINGS

FIG. 3 is a graph showing the fluctuations in oxygen precipitation with respect to the temperature change at a low-temperature heat process in the Experiment.

DETAILED DESCRIPTION

A general standard process to which the method of this invention is applied is as followed:

(1)

Heat process temperature: 1,280° C.
Heat process time: 60 hours
Heat process atmosphere: dry $O_2$ Step (1) is a heat process to initialize the heat history during the crystal growing. In each of the Examples described below, this heat process was added in order to assess the operation and results of the method of this invention accurately.

(2)

Heat process temperture: 400°–550° C.
Heat process time: 30–180 hours
Heat process atmosphere: dry $O_2$ Step (2) is a heat process to introduce the oxygen precipitation nuclei into a single crystal silicon uniformly and is the most significant process.

(3)

Heat process temperature: 800° C.
Heat process time: 4 hours
Heat process atmosphere: $N_2$ (4)

Heat process temperature: 1,000° C.
Heat process time: 16 hours
Heat process atmosphere: dry $O_2$ Steps (3) and (4) are oxygen precipitation heat processes, which are the conventional standard test processes.

Examples of this invention will now be described; this invention should by no means be limited to these specific examples.

EXAMPLE 1

Improved Distribution of Oxygen Precipitation in Crystal Grown Direction

Used Sample was as follows:
Conduction type: N type (Phosphorus dope)
Crystal diameter (Wafer diameter): 6" $\phi$ (150 mm)
Resistivity: 10 ($\Omega \cdot$cm)
Oxygen Concentration: 14–16 ($\times 10^{17}$ atoms/cm$^3$)
Carbon Concentration: <2.37($\times 10^{15}$ atoms/cm$^3$)
Thickness of samples to be thermally processed: 2.0 (mm)
This sample was thermally processed as follows:

(1)

A heat process was conducted under the following conditions:
Heat process temperature: 1,280° C.
Heat process time: 60 hours
Heat process atmosphere: dry O$_2$ (2)

Then a low-temperature heat process was conducted under the following conditions:
Heat process temperature: 450° C.
Heat process time: 60 hours
Heat process atmosphere: dry O$_2$ Thereafter the following heat processes were conducted.

(3)

Heat process temperature: 800° C.
Heat process time: 4 hours
Heat process atmosphere: N$_2$ (4)

Figure 1:
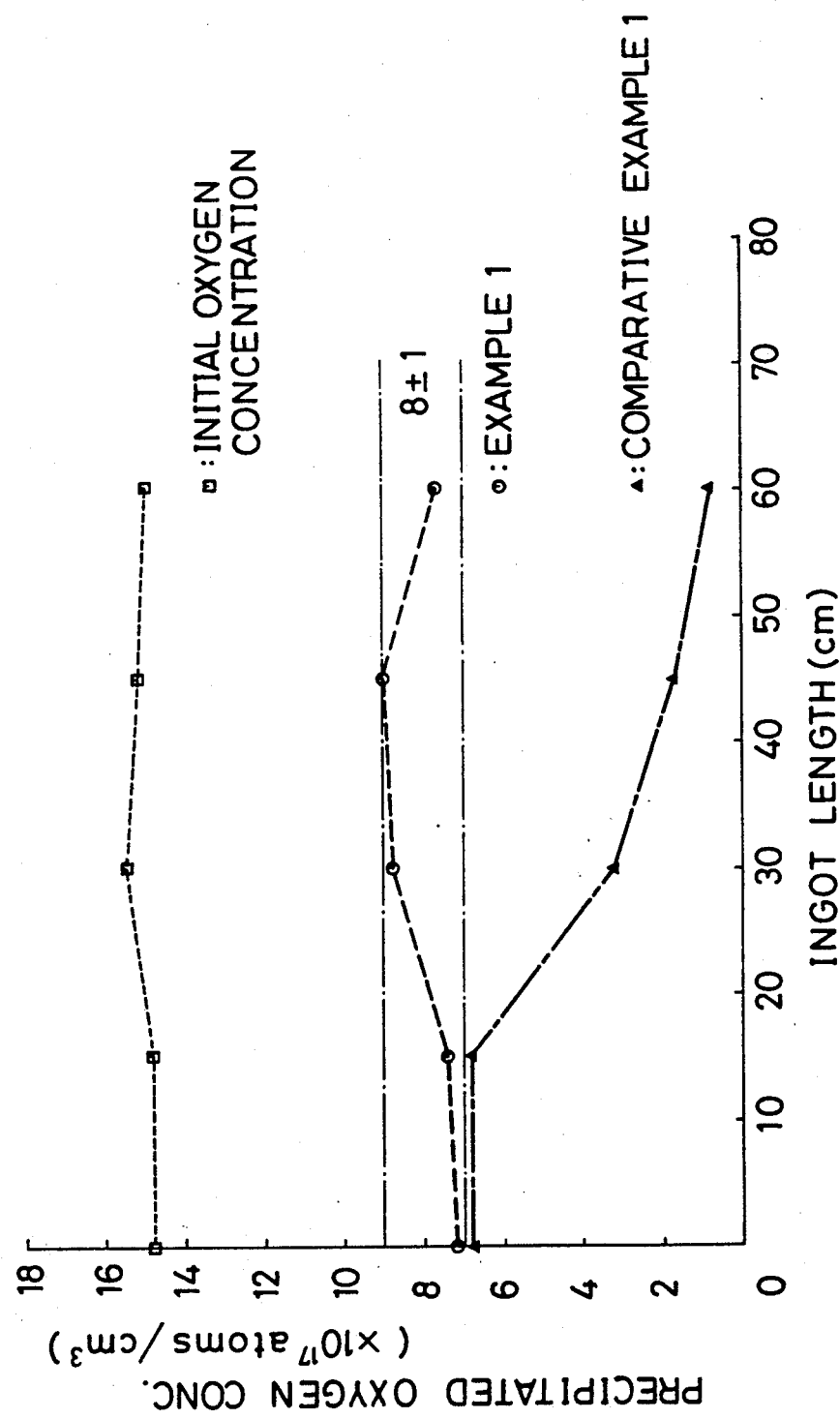
FIG. 1 is a graph showing the fluctuations in oxygen precipitation in Example 1 and Comparative Example 1.

Heat process temperature: 1,000° C.
Heat process time: 16 hours
Heat process atmosphere: dry O$_2$ The quantities of precipitated oxygen were measured, and the results of these measurements are shown in FIG. 1, from which it is noted that the oxygen precipitates were within the narrow range from 7 to 9 ($\times 10^{17}$ atoms/cm$^3$) and in particular that the local oxygen precipitate at the crystal bottom part did not become lower.

The oxygen precipitate was calculated by the following equation:

Oxygen precipitate = Oxygen concentration before heat process − Oxygen concentration after heat process.

The measurement of the oxygen concentrations was conducted by utilizing the infrared spectroscopic analysis.

COMPARATIVE EXAMPLE 1

Only the heat processes of steps (3) and (4) were conducted directly without having taken the preliminary heat processes of steps (1) and (2). The oxygen precipitates are measured, and the results of these measurements were shown in FIG. 1 along with the results of Example 1. From FIG. 1 it is noted that the oxygen precipitates ranged from 0.8 to 6.8 ($\times 10^{17}$ atoms/cm$^3$) and hence distributed non-uniformly and in particular that the local oxygen precipitates at the crystal bottom part became lower.

EXAMPLES 2 THROUGH 5

Uniform Distribution of Oxygen Precipitation in Crystal Growth Direction

Using the same sample as in Example 1, the heat process of step (2) were repeated four times under the same conditions as Example 1, except that the heat process time was selected to 0.5 hour, 1.0 hour, 2.0 hours and 3.0 hours, respectively.

Figure 2:
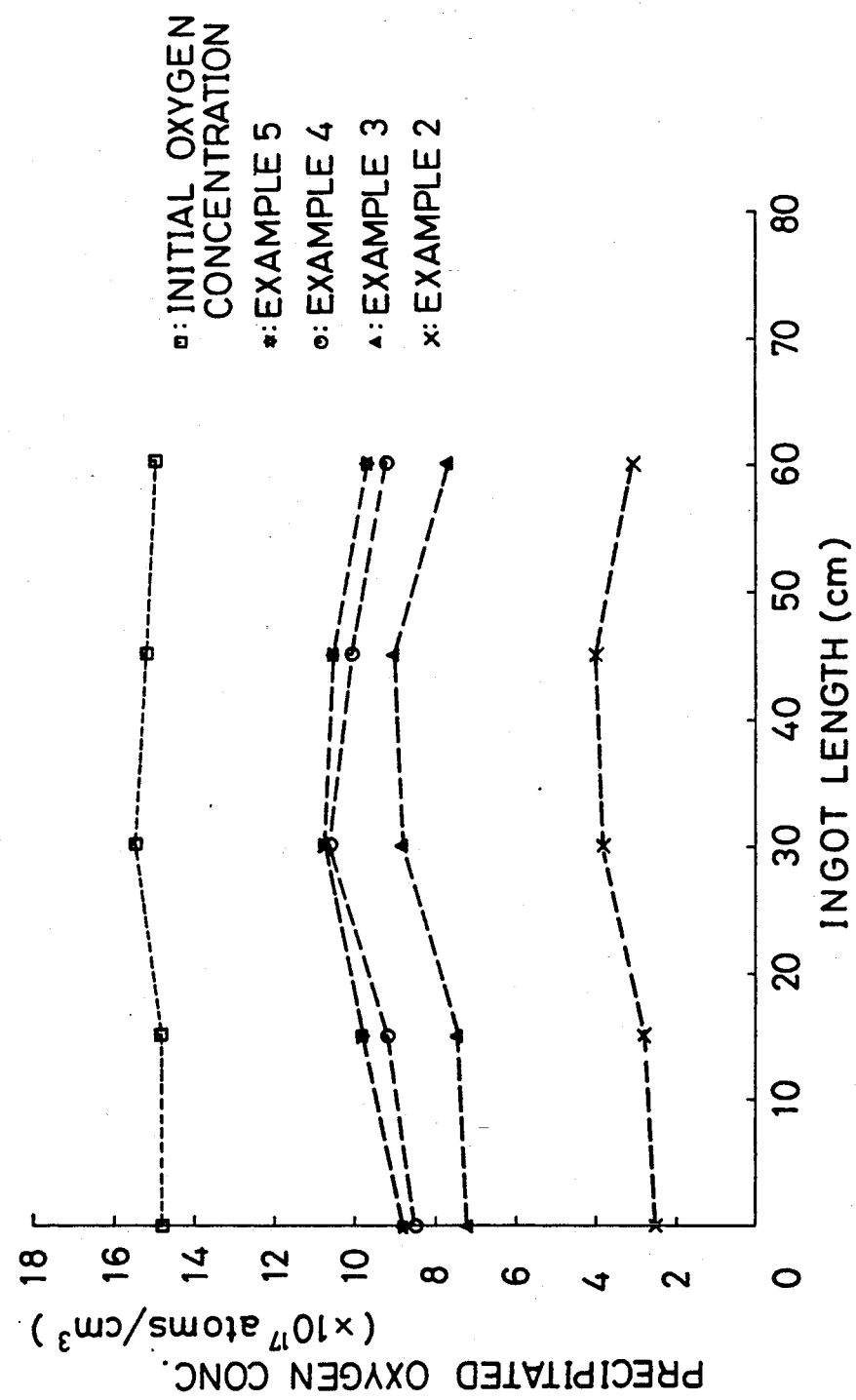
FIG. 2 is a graph similar to FIG. 1, showing the fluctuations in oxygen precipitation in Examples 2 through 5.

The oxygen precipitates were measured, and the results of these measurements are shown FIG. 2 and also in Table 1, in which the oxygen precipitates in Example 1 also are shown.

From the foregoing results, it was confirmed that by suitably setting the heat process time at 450° C., it is possible to produce a substantially uniform predetermined oxygen precipitate in the direction of crystal growth.

TABLE 1

| Example | Symbol | Heat process time (Hour) | Oxygen Precipitate ($\times 10^{17}$ atoms/cm$^3$) |
| --- | --- | --- | --- |
| 2 | X | 30 | 2.5–4.0 |
| 3 | Δ | 60 | 7.5–9.0 |
| 4 | ◯ | 120 | 8.5–10.6 |
| 5 | ☒ | 180 | 8.8–10.7 |
| Comparative Example 1 (no heat process) | | | 0.8–6.8 |

EXPERIMENT

The heat processes of steps (1), (2), (3) and (4) were conducted under the same conditions as Example 1, except that as the temperature of the step (2) was changed at intervals of 50° C. in the range from 300° C. to 1,000° C. and the process time of step (2) was selected to be a constant two hours at each and every temperature change. The same sample was used as in Example 1, except that the oxygen concentration was $1.52 \times 10^{17}$ (atoms/cm$^3$). The oxygen precipitates were measured with respect to the temperature change in the heat process of step (2), and the results of this measurement are shown in FIG. 3. From these measured results it was proved that the preferred temperature range with respect to the oxygen precipitation in the heat process of step (2) was from 400° C. to 550° C.

As described above, according to this invention, it is possible to provide a method for heat processing of a silicon ingot or wafer with improved distribution of oxygen precipitation, in which a predetermined oxygen precipitation can be obtained uniformly in the crystal growth direction, thus causing an adequate yield of manufacture of excellent IC products.

What is claimed is:
1. In a method for substantially uniformly precipitating oxygen throughout a single crystal or silicon which comprises pulling a single crystal of silicon by the Czochralski process, and then heat treating such crystal at an elevated temperature for a time sufficient to cause oxygen to precipitate in said crystal; the improvement which comprises, prior to said oxygen precipitation heat treatment, heat treating said single crystal at a high temperature ranging from 1200° to 1350° C. under conditions sufficient to initialize the heat history of said crystal during growing thereof; then heat treating said initialized single crystal at a temperature of about 400° to 500° C. for a time sufficient to cause oxygen precipitation nuclei to form substantially uniformly in said single crystal, and then carrying out said oxygen precipitation heat treatment at a temperature which is higher than said oxygen nuclei precipitation heat treating temperature.

2. A method according to claim 1, wherein said single crystal silicon is a silicon ingot.

3. A method according to claim 2, wherein said single crystal silicon produced by the Czochralski process is first thermally processed at a high temperature ranging from 1,200° C. to 1,350° C. under conditions sufficient to initialize the heat history of said crystal during growing thereof, and thereafter treating such at 400° to 500° C.

4. A method according to claim 2, wherein said single crystal silicon produced by the Czochralski process is thermally processed at a high temperature ranging from 1,200° C. to 1,350° C. under conditions sufficient to initialize the heat history of said crystal during growing thereof, and thereafter said low temperature treating is effected.

5. A method for heating treating a single crystal of silicon comprising thermally treating such at a high temperature ranging from 1200° to 1350° C. under conditions sufficient to initialize the heat history of said crystal during growing thereof; then heat treating said initialized single crystal at a low temperature ranging from 400° C. to 550° C., sufficient to introduce oxygen precipitation nuclei into said single crystal, in the furnace of a Czochralski crystal puller, as an after-heating step, after completion of pulling-up of the said single crystal silicon and then subjecting said heat treated crystal to a higher temperature sufficient to precipitate oxygen at said nuclei.

6. A method according to claim 5, wherein the said single crystal silicon produced by the Czochralski process is thermally processed at a high temperature ranging from 1,200° C. to 1,350° C. under conditions sufficient to initialize the heat history of said crystal during growing thereof, and thereafter said low temperature treating is effected.

7. A method according to claim 5, wherein said single crystal silicon is a silicon wafer.

8. A method for oxygen precipitate growth control heat processing of silicon, comprising thermally treating a single crystal silicon produced by the Czochralski process at a high temperature ranging from 1,200° C. to 1,300° C. under conditions sufficient to initialize the heat history of said crystal during growing thereof, then thermally processing such crystal at a low temperature ranging from 400° C. to less than 550° C. under conditions sufficient to introduce oxygen precipitation nuclei into said single crystal, and thereafter effecting an oxygen precipitation heat process.

9. A method as claimed in claim 8 wherein said oxygen precipitation is carried out at about 800° to 1000° C.

10. A method as claimed in claim 1 including effecting oxygen precipitation after said low temperature heat treatment by further treating said crystal at about 800° to 1000° C.

11. A method as claimed in claim 3 including effecting oxygen precipitation after said low temperature heat treatment by further treating said crystal at about 800° to 1000° C.

* * * * *